(12) United States Patent
Coffin et al.

(10) Patent No.: US 8,492,199 B2
(45) Date of Patent: Jul. 23, 2013

(54) REWORKABLE UNDERFILLS FOR CERAMIC MCM C4 PROTECTION

(75) Inventors: Jeffrey T. Coffin, Pleasant Valley, NY (US); Steven P. Ostrander, Poughkeepsie, NY (US); Frank L. Pompeo, Redding, CT (US); Jiali Wu, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/252,424

(22) Filed: Oct. 4, 2011

(65) Prior Publication Data
US 2012/0021567 A1    Jan. 26, 2012

Related U.S. Application Data

(62) Division of application No. 11/425,208, filed on Jun. 20, 2006, now abandoned.

(51) Int. Cl.
*H01L 21/56* (2006.01)

(52) U.S. Cl.
USPC .......................................... 438/108; 438/118

(58) Field of Classification Search
USPC ................................. 438/118, 108
See application file for complete search history.

(56) References Cited

U.S. PATENT DOCUMENTS

| | | | |
|---|---|---|---|
| 4,562,091 A | 12/1985 | Sachdev et al. | |
| 5,002,818 A | 3/1991 | Licari et al. | |
| 5,191,404 A | 3/1993 | Wu et al. | |
| 5,217,805 A | 6/1993 | Kessel et al. | |
| 5,700,581 A | 12/1997 | Sachdev et al. | |
| 6,020,409 A * | 2/2000 | Alvarez et al. | 524/267 |
| 6,057,381 A * | 5/2000 | Ma et al. | 522/99 |
| 6,172,141 B1 | 1/2001 | Wong et al. | |
| 6,360,938 B2 * | 3/2002 | DeLaurentis et al. | 228/191 |
| 6,458,681 B1 * | 10/2002 | DiStefano et al. | 438/612 |
| 6,498,260 B2 | 12/2002 | Wang et al. | |
| 6,503,874 B2 * | 1/2003 | Sachdev et al. | 510/177 |
| 6,528,352 B1 * | 3/2003 | Jackson et al. | 438/118 |
| 6,548,175 B2 | 4/2003 | Sachdev et al. | |
| 6,570,029 B2 | 5/2003 | Wang et al. | |
| 6,596,559 B2 | 7/2003 | Kodnani et al. | |
| 6,599,774 B2 | 7/2003 | Hultmark et al. | |
| 6,620,308 B2 | 9/2003 | Gilbert | |
| 6,743,868 B2 | 6/2004 | Fournier et al. | |
| 6,906,425 B2 | 6/2005 | Stewart et al. | |
| 6,916,890 B1 | 7/2005 | Woods et al. | |
| 6,936,664 B2 | 8/2005 | Woods et al. | |
| 7,083,684 B2 * | 8/2006 | Fukuda et al. | 134/42 |
| 7,381,590 B2 * | 6/2008 | Choudhary et al. | 438/118 |
| 2001/0006188 A1 * | 7/2001 | DeLaurentis et al. | 228/264 |
| 2002/0000239 A1 * | 1/2002 | Sachdev et al. | 134/2 |
| 2002/0013420 A1 | 1/2002 | Wang et al. | |
| 2002/0035201 A1 | 3/2002 | Wang et al. | |
| 2002/0094940 A1 * | 7/2002 | Sachdev et al. | 510/177 |
| 2002/0109218 A1 * | 8/2002 | Akram | 257/697 |
| 2004/0102544 A1 | 5/2004 | Woods et al. | |
| 2004/0220361 A1 * | 11/2004 | Fukuda et al. | 526/126 |
| 2006/0094809 A1 | 5/2006 | Simone et al. | |
| 2007/0212820 A1 * | 9/2007 | Choudhary et al. | 438/118 |

FOREIGN PATENT DOCUMENTS

| | | |
|---|---|---|
| JP | 63248822 | 10/1988 |
| JP | 2004179552 | 6/2004 |
| JP | 2004307859 | 11/2004 |

OTHER PUBLICATIONS

John H. MacMillan Ph.D., Formulating Silicone Adhesives and Sealants, United Chemical Technologies, Inc., www.unitedchem.com, May 14, 2006.

* cited by examiner

*Primary Examiner* — Margaret Moore
(74) *Attorney, Agent, or Firm* — DeLio & Peterson, LLC; Kelly M. Nowak; Joseph Petrokaitis

(57) ABSTRACT

The present invention provides chip containing electronic devices such as Multichip Ceramic Modules (MCM's) containing a plurality of chips on a substrate which chips are underfilled with a reworkable composition which allows one or more chips to be removed from the device and replaced. The reworkable compositions contain a base resin which is not cross-linkable and which forms a matrix with a linear curable component or preferably a combination of linear curable components which curable components are cross-linkable and when cured form a cross-linked domain in the base resin matrix. A suitable cross-linking catalyst such as Pt is used and optionally a filler preferably silane surface treated silica. The preferred base resin is linear polydimethylsiloxane and the preferred curable components are vinyl terminated linear poly dimethyl siloxane and hydrogen terminated linear poly dimethyl siloxane.

20 Claims, 2 Drawing Sheets

REWORKABLE UNDERFILLS FOR CERAMIC MCM C4 PROTECTION

BACKGROUND OF THE INVENTION

1. Field of the Invention

The present invention relates to chip containing electronic devices and, in particular, to Multichip Ceramic Modules (MCM's) containing a plurality of chips electrically connected to a substrate with solder bumps, which chips are underfilled with a reworkable composition which allows one or more chips to be removed from the module and replaced.

2. Description of Related Art

Electronic components such as Multichip Ceramic Modules (MCM's) are key components for many high-end computer servers and mainframes. MCM's are particularly important because they contain numerous chips on a substrate. However, if one of the chips is defective due to electric issues it must be replaced. Without the ability to replace the chip, typically termed rework of the chip, the cost of MCMs would become prohibitive.

Controlled Collapse Chip Connection is an interconnect technology developed by IBM as an alternative to wire bonding. This technology is generally known as C4 technology or flip chip packaging. Broadly stated, one or more integrated circuit chips are mounted above a single or multi-layer substrate and pads on each chip are electrically connected to corresponding pads on the substrate by a plurality of electrical connections such as solder bumps. The integrated circuit chips may be assembled on the substrate in a solder bump array such as a 10×10 array. The chip bumped substrate is then typically electrically connected to another electronic device such as a circuit board by pin connectors with the total package being used in an electronic device such as a computer.

Flip chip packaging is described in U.S. Pat. No. 5,191,404 which patent is hereby incorporated by reference. In general, flip chip joining is desirable for many applications because the footprint or area required to bond the chip to the substrate is equal to the area of the chip itself. Flip chip joining also exploits the use of a relatively small solder bump which typically measures a height of approximately 1 mil to 1.5 mils and a width of approximately 2 to 4 mils to join the pads on the chip to corresponding pads on the substrate. Electrical and mechanical interconnects are formed simultaneously by reflowing the bumps at an elevated temperature. The C4 joining process is self-aligning in that the wetting action of the solder will align the chip's bump pattern to the corresponding substrate pads. This action compensates for chip to substrate misalignment up to several mils which may be incurred during chip placement.

In the joined flip chip package there is necessarily an opening or space between the pad containing surface of the integrated circuit chip and the pad containing surface of the joined substrate resulting from the thickness of the pads on each surface and the solder bump connection between the pads. This open space cannot be tolerated because any interference with the solder connections will adversely affect the performance of the package. For example, moisture, mobile ions, acidic or alkaline species, which could be from corrosive surroundings or from infusion of thermal paste used to increase heat transfer from the chip, and the mechanical integrity of the chip due to the possible breaking of the solder bump electrical connections are all serious problems. To solve these problems, the solder bumps of the joined integrated circuit chips and substrate are typically encapsulated totally with various types of material, such as a liquid, and such a sealant is used around the chip edges to seal the joined opening.

Flip chip bonding offers many advantages in electronics manufacture and one of the most important is the ability to remove and replace the chip without scrapping the substrate and adjacent chips. This removal of the chip by heating and lifting of the chip from the substrate and replacement with typically a new chip is termed rework and can be performed numerous times without degrading the quality or reliability of the reworked electronic component.

Encapsulation of the flip chip packages however presents rework and other problems. The flip chip package must be reliable and thermo mechanical mismatches between the encapsulant, chip, substrate and/or solder bumps must be minimized to avoid stressing and damaging of the package, in particular, the solder interconnects. The encapsulant must also be able to be heated and softened or preferably be soluble in a solvent such as xylene for the lift-off (rework) procedure.

The conventional underfill process to encapsulate the space between a single chip bonded to a substrate surface typically applies the underfill material to the substrate adjacent to the periphery of the chip to be underfilled. Capillary action draws the underfill encapsulation material into the space between the chip and the substrate to form a void free filled space between the chip and the substrate.

Historically, there are two types of MCM seals to protect the chips from damage, namely, a hermetic seal and a non-hermetic seal for preventing moisture permeation and mobile ion ingress to the chip joints. Most hermetic seals are formed according to metal isothermal interdiffusion mechanism, such as C-ring seal. Non-hermetic seals also named as reliability without hermeticity (RWOH), use polymer based composite material to form a non-hermetic seal band. Compared with hermetic seal, non-hermetic seal is less protective in terms of moisture ingress and mobile ion permeation. Therefore, non-hermetic sealed MCMs show varied level C4 corrosion when exposed to temperature and humidity environment during real application.

Regardless of the type seal, however, it is necessary to underfill the chips and an ideal reworkable underfill (RUF) should possess several key characteristics such as-reworkability, low modulus, thermal stability, no interference with surrounding materials, such as thermal paste, compatible with sealing band or c-ring which is used for sealing MCM's, and be environmentally safe. Also, RUFs should be reworkable in neutral solution to prevent any chemical attack to C4 interconnects; have low deep thermal cycling introduced thermomechanical stress; be thermally and chemically stable at 125° C. for 1,000 hours; and provide sufficient protection against moisture, $CO_2$ ingress and carboxylic acid permeation.

SUMMARY OF THE INVENTION

Bearing in mind the problems and deficiencies of the prior art, it is therefore an object of the present invention to provide a reworkable underfill and/or dam (perimeter seal) composition for protecting MCM C4/solder interconnects from corrosion and for making chip containing components such as MCM's.

It is another object of the present invention to provide a method for underfilling chips and/or forming a dam (perimeter seal) on electronic components such as MCM's with a reworkable underfill and/or dam composition.

Still other objects and advantages of the invention will in part be obvious and will in part be apparent from the specification.

The above and other objects, which will be apparent to those skilled in the art, are achieved in the present invention which is directed to a reworkable underfill and/or dam composition for C4 joint protection such as a ceramic MCM comprising:

a non-cross-linkable or low cross-linkable base resin containing no reactive groups such as linear polydimethyl siloxane;

a linear cross-linkable component preferably a linear or branched reactive siloxane having reactive end groups such as a vinyl terminated polydimethyl siloxane and/or a hydrogen terminated polydimethyl siloxane;

a catalyst for the reactive siloxanes such as the vinyl terminated and hydrogen terminated siloxanes which catalyst is preferably Pt in a cyclic vinyl siloxane; and optionally a filler such as a silane treated filler preferably silica.

The above mentioned silicone system is the preferred applicable material system. Other systems are described further hereinbelow but the following description will be directed to the silicone system for convenience and its demonstrated effectiveness.

In another aspect of the invention a method is provided for underfilling and/or forming a dam for ceramic MCM's and their electronic components having C4 solder joints comprising the steps of:

providing a substrate such as a ceramic MCM with C4 solder joints;

underfilling the joined chip and/or forming a dam around the chip with a reworkable underfill composition comprising:

a non-cross-linkable or low cross-linkable base resin containing no reactive groups such as linear polydimethyl siloxane;

a linear cross-linkable component preferably a linear or branched reactive siloxane having reactive end groups such as a vinyl terminated polydimethyl siloxane and/or a hydrogen terminated polydimethyl siloxane;

a catalyst for the reactive siloxanes such as the vinyl terminated and hydrogen terminated siloxanes which catalyst is preferably Pt in a cyclic vinyl siloxane; and optionally a filler such as a silane treated filler preferably silica.

curing the underfilled and/or dammed MCM; and reworking the underfilled MCM if necessary by removing the underfill composition and/or dam composition, separating the chip from the MCM and replacing the chip by joining a chip to the MCM and underfilling and damming the joined chip preferably using the above composition.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
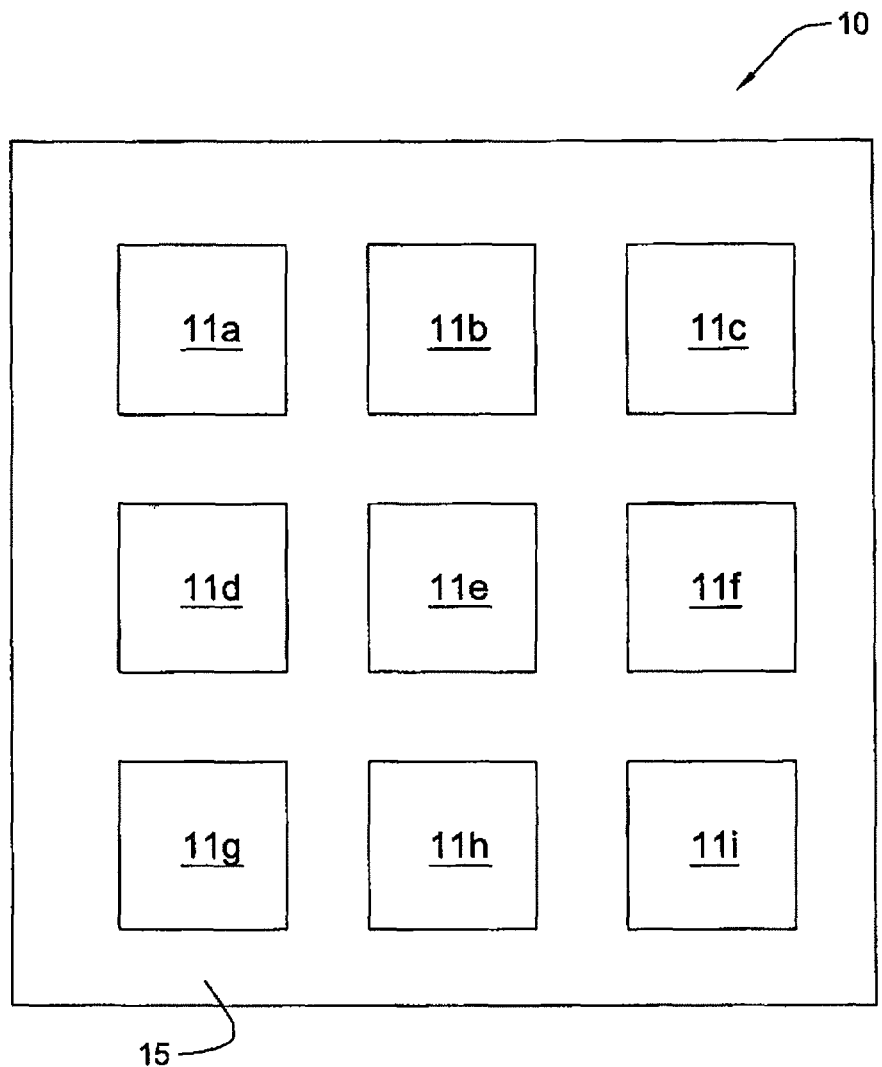
FIG. 1 is a plan view of an MCM electronic component.

In describing the preferred embodiment of the present invention, reference will be made herein to FIGS. 1-3 of the drawings in which like numerals refer to like features of the invention.

The subject invention provides reworkable underfill and dam compositions preferably silicone based soft reworkable underfill compositions (S-RUF) which have excellent chip protection properties and rework characteristics. The underfill compositions can be removed in xylene at room temperature; the modulus is as low as 100 cSt; is thermally stable above 180° C.; no chemical interaction with ATC mineral oil; and environmental protection to PbSn C4. More importantly, the type of reworkable underfill can be efficiently removed from micrometer level C4 gap, which could be as thin as 50-60 micro, simply by soaking the module into room temperature xylene, IPA or ketone, xylene is preferred or spin spray with aforementioned solvents.

Organic or polymeric materials used as the base resin of the RUFs are not reactive (non-crosslinkable) and include, but are not limited to, a polysiloxane having no or low cross-linkability such as the preferred linear polydimethyl siloxane, polyurethane, mineral oil, polyacrylate, polyacrylic ester, CTBN (carboxy-terminated butadiene-acrylonitrile) modified polyester, polystyrene, isoprene, epoxy modified siloxane, etc. The base resin is used to from a matrix for curable polymers which react to form a cross-linked polymer embedded in the base resin matrix. By non-reactive is meant that the base resin is not cross-linkable under normal cross-linking conditions, e.g., the base resin does not contain a reactive group such as vinyl, H, hydroxy-, carboxylic acid etc., but contains non-reactive groups such as methyl, ethyl, benzyl, isopropyl, etc.

The RUF compositions also comprise at least one and preferably two linear cross-linkable (curable or reactive) components such as a vinyl-terminated linear or branched siloxane and a hydrogen-terminated linear or branched siloxane. Other polymer or monomer components which are curable include ester terminated and carbocyclic anhydride terminated, or vinyl terminated linear or branched alkanes; acylic or acrylic ester; ester, cyano, anhydride, amide, vinyl, terminated CTBN, alphatic or aromatic anhydride, polyamide, polyimide, polyurethane, etc.

A curing catalyst, preferably Pt in a cyclic vinyl siloxane, is used to cure the cross-linkable polymers. H2PtC16, Pt (C6H5)2, ZnO, etc inorganic catalysts are also preferred for the silicone system. Peroxide, amine, and metal chelate such as Co (AcAc)2 can also be used as catalysts in epoxy, acrylic, polyurethane and polystyrene base resin systems.

A filler such as a silane treated silica filler is preferably used in the composition to provide a dam composition which is used around the underfilled chip (perimeter), but may be used also in the underfill composition. Boronitride, carbon fiber, nano silica, nano carbon tube, alumina, etc and non-electroconductive fillers are also suitable for this application The MCM's or any other electronic component may be made using any process for chip join. Post chip join and test, the chips are underfilled and/or dammed with the composition of the invention. Following underfill and/or dam curing, the modules proceed through standard assembly and test. If rework is required, modules are disassembled, sealants and underfill removed, defect chip(s) replaced, the new chips re-underfilled and the module reassembled.

When lead containing or lead-free C4 interconnects (solders) are exposed to moisture, mobile ions under bias without protective insulation material in between, electrochemistry initiated chemical corrosion is very likely to happen. If there is alien corrosive chemical species, such as adipic acid, stearic acid, and other types organic acid formed during ATC paste thermal degradation and/or electrochemical corrosion may be greatly accelerated. Thus, to keep the moisture, mobile ion and alien carboxylic acids under a corrosion-initiated level, a protective material is needed to underfill the C4 joints.

More importantly, as process technologies continue to shrink, the critical charge required to cause a single-event-upset (SEU) is decreasing faster than the charge-collection area in the memory cell. Therefore, with smaller geometries, such as 90 nm, soft errors are more of concern.

At the process level, the use of purer packaging materials could lower alpha emission. However, tremendous efforts are needed to reduce the radioactive element level for current glass ceramic (GC) raw materials. GC fabrication processes, such as ball mill and in-house ceramic slurry formulation, and top surface metallurgy (TSM) C4 plating are very likely to introduce alpha particles. Therefore, a high purity with low alpha particle underfill is needed to protect C4 chip from alpha particle radiation damage.

To meet all the requirements mentioned above, a reworkable underfill is the easiest and lowest cost solution to high-end MCM's.

Referring to FIG. 1, a plan view of an MCM electronic component is shown as numeral 10. Chips 11a-11i are shown on substrate 15 and the chips are electrically connected to the substrate by C4 joints.

Figure 2:
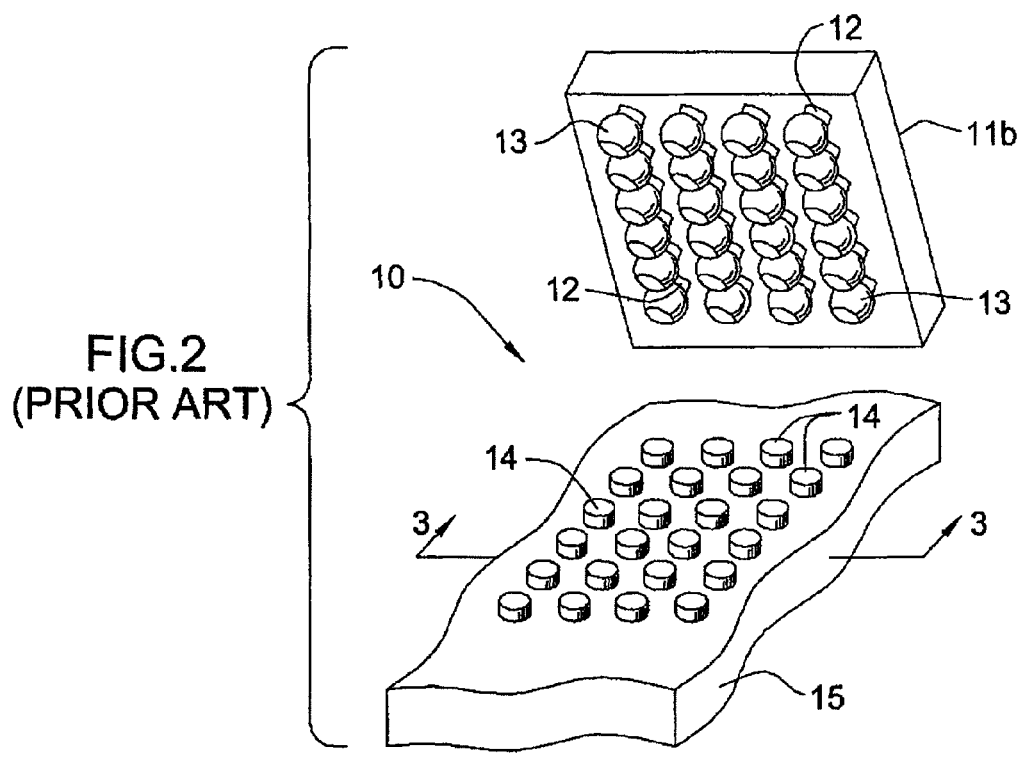
FIG. 2 is a partial view of the MCM of FIG. 1 comprising an integrated circuit chip containing pads and solder bumps which chip is to be electrically connected to corresponding pads on an interconnection substrate.
Figure 3:
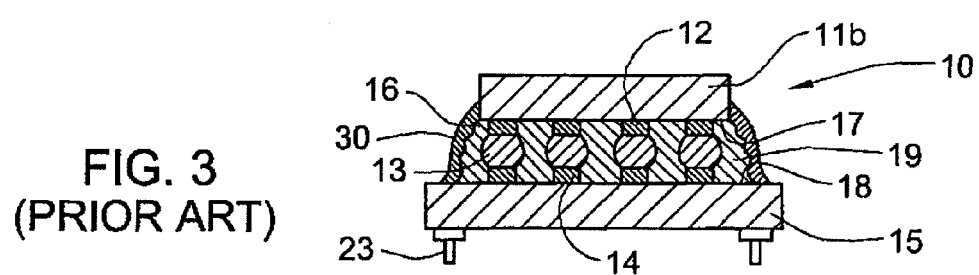
FIG. 3 is a cross-sectional view of FIG. 2 taken along lines 3-3 after the chip is joined to the substrate showing the chip and substrate electrical interconnections being encapsulated with an underfill and dam composition.

Referring now to FIGS. 2 and 3, integrated circuit chip 11b and interconnection substrate 15 of electronic component 10 is shown. Integrated circuit chip 11b is shown having conductive pads 12 overlaid with solder bumps 13. Corresponding conductive pads 14 are shown on substrate 15. Referring to FIG. 3, electronic component 10 is depicted in cross-section wherein integrated circuit chip 11b is solder connected to interconnection substrate 15. The chip 11b is electrically connected to the substrate 15 by a plurality of solder connections 13 such as solder bumps, using C4 or flip chip packaging. The lower surface of substrate 15 may contain connectors such as pin connectors 23 for connection of the substrate 15 to another electronic device such as a circuit board.

The solder interconnections 13 of electronic component 10 as shown in FIG. 3 are encapsulated by a composition of the invention 16 shown filling the space 19 between pad containing surface 17 of chip 11b and pad containing surface 18 of substrate 15. The encapsulant 16 is shown both around the periphery of chip 11 and under the chip totally encapsulating all the solder bump 13 connections. A dam 100 is shown around the underfill 16. The dam is preferably the same composition as the underfill composition 16 except that it preferably contains a filler such as a silane treated silica filler component.

The reworkable composition of the invention comprises a linear thermoplastic base polymer, preferably poly(dimethylsiloxane) (PDMS), a linear curing agent preferably comprising a siloxane having reactive end groups such as a vinyl containing terminated PDMS and/or a hydrogen containing terminated PDMS, a curing catalyst and optionally a filler.

The preferred PDMS may be represented by the following formula and structure:

wherein n is 10 to 2760 (MW 1250-204,000)

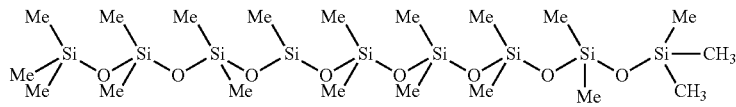

The vinyl terminated PDMS may be represented by the formula and structure:

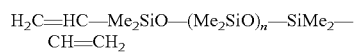

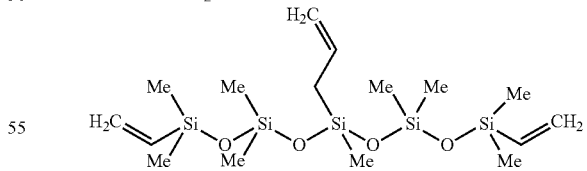

wherein n is 2 to 5000.

The hydro terminated PDMS may be represented by the formula and structure:

wherein n is 2 to 5000.

When the composition containing both vinyl terminated and hydro terminated siloxanes is cured a structure such as the following structure is obtained:

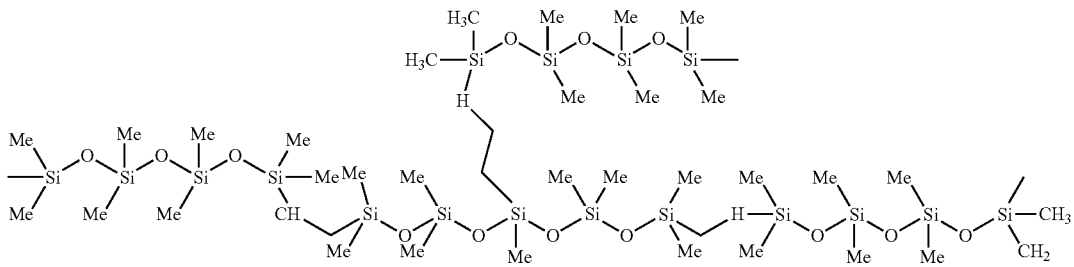

This structure is embedded in the base resin matrix forming an underfill having excellent reworkability properties.

It will be appreciated by those skilled in the art that the underfill and dam composition of the invention when cured forms a highly cross-linked domain in a base resin matrix, which cured composition has excellent reworkable characteristics. In particular, the cured composition is highly soluble in xylene and if the chip requires replacement, the underfill can easily be removed by immersion of the module or the chip in xylene or other suitable solvent. The reworkable underfill can be removed in xylene at room temperature and once removed, the chip can be removed from the substrate using heat to melt the solder interconnection. The substrate would then be dressed and cleaned providing a clean C4 pad site to which a new chip can be rejoined.

The base polymer forms a matrix for the underfill and is doped (mixed) with the reactive siloxanes. When cured, the reactive siloxanes react and cross-link to form the highly cross-linked domain comprising the reacted and cross-linked reactive siloxanes in the non-reactive base polymer matrix. The cross-linked domain has the properties described above and is easily removable in xylene at room temperature. The preferred siloxane base polymer preferably has a molecular weight of about 1250 to 204,000, or more. Only one of the curing agents need be used in the composition, but it is preferred to use both the vinyl terminated siloxane and hydrogen terminated siloxane curing agents in a weight ratio of 1:10 to about 10:1. The base resin is used in a weight ratio of base resin to curing agent of about 20:1 to 1:10 preferably from 10:1, to 1:5. The curing catalyst is present in the composition in an amount of about 0.001 wt. % to 5 wt. % or more. The filler if used in the SRUF composition, may be used in an amount of about 1 wt. % to 10 wt. %, or more. A silane surface treated silica is preferred.

Use of the underfill and/or dam composition of the invention has been found to provide excellent reworkable characteristics by dissolution in xylene, is not chemically interactive, non-corrosive and is commercially acceptable. Chips connected to a substrate forming an MCM and underfilled with the composition of the invention were easily reworked by dissolution in xylene at room temperature, melting of the solder interconnection, dressing and cleaning Solder residue by Cu block and reattachment of a chip and underfill with the composition of the invention.

The underfill composition is used by mixing the components together and underfilling the chips. The underfilled chip is then cured by reacting the composition by heating the module assembly to a temperature of 80 to 150° C., preferably 100 to 125° C. for 30 to 120 minutes, preferably 45 to 75 minutes.

While the present invention has been particularly described, in conjunction with a specific preferred embodiment, it is evident that many alternatives, modifications, and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for underfilling and/or forming a dam for electronic components having C4 joints comprising the steps of:
   providing a chip containing an electronic component with C4 solder joints;
   joining the chip to a substrate to provide an electronic module;
   underfilling and/or forming a dam around the chip joined to the substrate using a reworkable underfill composition comprising:
   a non-cross-linkable linear thermoplastic base resin containing non-reactive groups;
   a linear cross-linkable polymer;
   a catalyst for the cross-linkable polymer; and
   a filler;
   curing the reworkable underfill composition; and
   reworking the electronic module by removing the cured reworkable underfill composition using xylene at room temperature, separating the chip from the substrate, joining a new chip to the substrate, and underfilling and/or damming the newly joined new chip using the reworkable underfill composition.

2. The method of claim 1 wherein the linear thermoplastic base resin contains non-reactive groups selected from the group consisting of methyl, ethyl, benzyl, and isopropyl, and does not include a reactive group selected from the group consisting of vinyl, H, hydroxy-, and carboxylic acid 3. The method of claim 2 wherein the linear thermoplastic base resin is linear polydimethyl siloxane and the linear cross-linkable component is vinyl terminated linear siloxane or hydrogen terminated linear siloxane.

4. The method of claim 3 wherein the cross-linkable component is both the vinyl terminated siloxane and the hydrogen terminated siloxane.

5. The method of claim 4 wherein the catalyst is Pt in a cyclic vinyl siloxane, and the filler is silane surface treated silica.

6. The method of claim 1 wherein the reworkable underfill composition is cured by heating the electronic module to a temperature ranging between 80° C. to 150° C. for 30 to 120 minutes.

7. The method of claim 1 wherein the electronic module is immersed and soaked in the xylene at room temperature to remove the chip from the substrate.

8. The method of claim 1 wherein the base resin is selected from the group consisting of linear polydimethyl siloxane, polyacrylate, polyacrylic ester, CTBN (carboxy-terminated butadiene-acrylonitrile) modified polyester, polystyrene, isoprene and epoxy modified siloxane.

9. The method of claim 8 wherein the cross-linkable component is selected from the group consisting of ester terminated, carbocyclic anhydride terminated, vinyl terminated linear and branched alkanes; acylic and acrylic ester; polyamide; polyimide and polyurethane.

10. A method for underfilling and/or forming a dam for electronic components having C4 joints comprising the steps of:
    providing a chip containing an electronic component with C4 solder joints;
    joining the chip to a substrate to provide an electronic module;
    underfilling and/or forming a dam around the chip joined to the substrate using a reworkable underfill composition consisting essentially of:
        a non-cross-linkable linear thermoplastic base polymer containing non-reactive groups selected from the group consisting of methyl, ethyl, benzyl, and isopropyl;
        a linear cross-linkable polymer;
        a catalyst for the linear cross-linkable polymer; and
        optionally a filler;
    curing the reworkable underfill composition; and
    reworking the electronic module by removing the cured reworkable underfill composition using xylene at room temperature, separating the chip from the substrate, joining a new chip to the substrate, and underfilling and/or damming the newly joined new chip using the reworkable underfill composition.

11. The method of claim 10 wherein the linear thermoplastic base polymer does not include a reactive group selected from the group consisting of vinyl, H, hydroxy-, and carboxylic acid.

12. The method of claim 11 wherein the linear thermoplastic base polymer is linear polydimethyl siloxane and the linear cross-linkable polymer is vinyl terminated linear siloxane or hydrogen terminated linear siloxane.

13. The method of claim 12 wherein the catalyst is Pt in a cyclic vinyl siloxane.

14. The method of claim 13 wherein the filler is silica.

15. The method of claim 10 wherein the linear thermoplastic base polymer is selected from the group consisting of linear polydimethyl siloxane, polyacrylate, polyacrylic ester, CTBN (carboxy-terminated butadiene-acrylonitrile) modified polyester, polystyrene, isoprene and epoxy modified siloxane.

16. The method of claim 10 wherein the electronic module is immersed and soaked in the xylene at room temperature to remove the chip from the substrate.

17. A method for underfilling and/or forming a dam for electronic components having C4 joints comprising the steps of:
    providing a chip containing an electronic component with C4 solder joints;
    joining the chip to a substrate to provide an electronic module;
    underfilling and/or forming a dam around the chip joined to the substrate using a reworkable underfill composition consisting of:
        a non-cross-linkable linear thermoplastic base polymer containing non-reactive groups selected from the group consisting of methyl, ethyl, benzyl, and isopropyl, and does not include a reactive group selected from the group consisting of vinyl, H, hydroxy-, and carboxylic acid;
        a linear cross-linkable polymer;
        a catalyst for the linear cross-linkable polymer; and
        a filler;
    curing the reworkable underfill composition; and
    reworking the electronic module by removing the cured reworkable underfill composition using xylene at room temperature, separating the chip from the substrate, joining a new chip to the substrate, and underfilling and/or damming the newly joined new chip using the reworkable underfill composition.

18. The method of claim 17 wherein the reworkable underfill composition is removed by soaking the electronic module in the xylene at room temperature.

19. The method of claim 17 wherein a weight ratio of the non-cross-linkable linear thermoplastic base polymer to the linear cross-linkable polymer in the reworkable underfill composition ranges from about 20:1 to 1:10.

20. The method of claim 19 wherein the catalyst is present in the reworkable underfill composition in an amount of about 0.001 wt. % to 5 wt. % or more.

* * * * *